United States Patent [19]

Proud, Jr. et al.

[11] 4,104,556
[45] Aug. 1, 1978

[54] HIGH ENERGY RADIO FREQUENCY PULSE GENERATORS

[75] Inventors: Joseph M. Proud, Jr., Wellesley Hills; Charles N. Fallier, Jr., Westford, both of Mass.

[73] Assignee: GTE Laboratories Incorporated, Waltham, Mass.

[21] Appl. No.: 741,926

[22] Filed: Nov. 15, 1976

[51] Int. Cl.² .......................... H01J 7/46; H01J 19/80
[52] U.S. Cl. ...................................... 315/39; 307/106; 333/13; 333/82 B; 331/127
[58] Field of Search ................... 315/39; 307/106, 107; 333/13, 82 B; 331/127

[56] References Cited

U.S. PATENT DOCUMENTS

| | | | |
|---|---|---|---|
| 2,932,802 | 4/1960 | Lorch | 307/106 X |
| 3,479,555 | 11/1969 | Garwin | 315/39 |
| 3,484,619 | 12/1969 | Proud, Jr. | 315/39 X |
| 3,564,277 | 8/1969 | Maguire | 307/106 |
| 3,748,528 | 7/1973 | Cronson | 315/39 |

Primary Examiner—Saxfield Chatmon, Jr.
Attorney, Agent, or Firm—Fred Fisher

[57] ABSTRACT

A radio frequency pulse generator capable of providing high energy pulses having an in-line construction includes an annularly shaped spark gap. The input voltage is connected to the resonant element through a central aperture provided in the spark gap rings for high efficiency operation.

8 Claims, 1 Drawing Figure

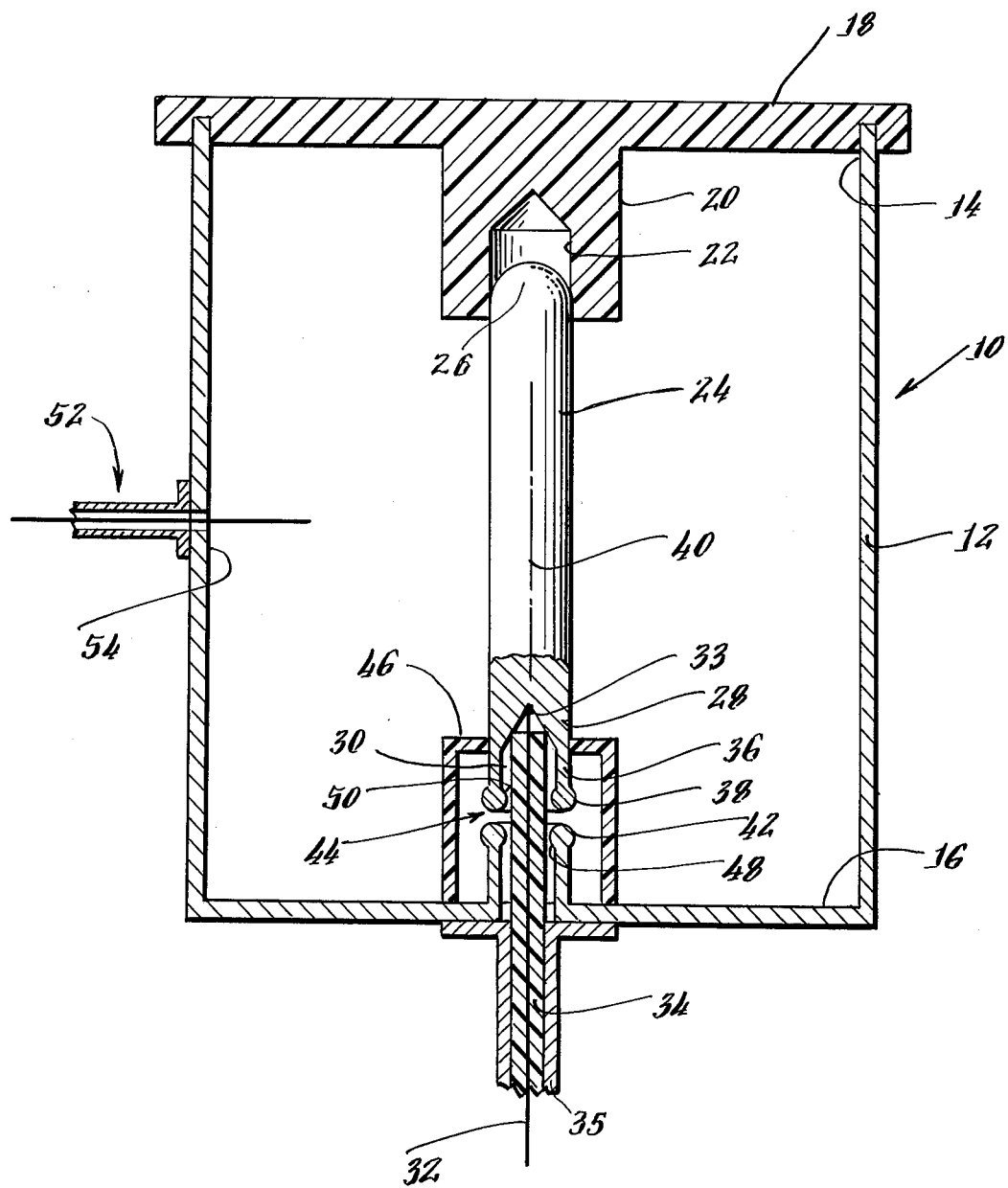

4,104,556

HIGH ENERGY RADIO FREQUENCY PULSE GENERATORS

BACKGROUND OF THE INVENTION

This invention relates to radio frequency pulse generating devices and, in particular, to high energy microwave pulse generators.

It is known to produce bursts of microwave energy by switching power across a gap or gaps in the central conductor of a coaxial line or waveguide, as shown in U.S. Pat. No. 3,521,121, issued July 21, 1970, to J. M. Proud, Jr., U.S. Pat. No. 3,484,619, issued Dec. 16, 1969, to J. M. Proud, Jr. and U.S. Pat. No. 3,748,528, issued July 24, 1973, to H. Cronson. These devices are capable of providing high energy pulse bursts of microwave power up to approximately 10 GHz. In the waveguide device disclosed in the patent to H. Cronson, the center conductor of the coaxial line is provided with one or more switching gaps along its length and/or the end post spaced from the interior wall of the waveguide. A radio frequency (RF) block or impedance is disposed around the post adjacent the first switching gap with the gaps so dimensioned that energy switched by the first gap can pass the block or impedance, but oscillations caused by the discharge at the second gap cannot pass the block. The spark gap functions to steepen the leading edge of the travelling wave. The prior art structures possess several shortcomings which the instant invention overcomes. These shortcomings include but are not limited to poor efficiency, since the capacitance of the RF block, to be effective, must be relatively large compared to the distributed capacity of the end post. The capacitance of the RF block stores most of the initial energy and, upon discharge, tends to react with the lumped value of inductance in the post, resulting in low frequency oscillations which typically are less than one-half the desired operating frequency. In the Cronson waveguide device, mentioned hereinbefore, such oscillations lie below the waveguide cut-off frequency and would not be observed. However, the existence of such oscillations have been observed by the applicant using coaxial resonators operating in the lowest TEM mode with no cut-off frequency. This problem cannot be overcome by reducing the capacitance of the RF block since this would permit the microwave oscillations to leak out of the resonant structure.

Furthermore, the Cronson device requires a spark gap of relatively small dimensions to provide rapid charging of the end post. This causes the small electrode surface of the gap to wear rapidly under sparking causing rapid deterioration of the fast switching properties of the closely spaced spark gap. A sliding short is also used to adjust the coupling between the waveguide and the end post. However, it does not enable tuning of the generator since the microwave frequency generated is determined primarily by the cross-sectional dimensions of the waveguide.

Therefore, it is an object of the present invention to overcome the shortcomings of presently known radio frequency generators.

It is a further object of the present invention to provide a highly efficient, high power radio frequency generator.

Another object of the present invention is to provide a simplified radio frequency generator which converts DC energy into RF energy.

A still further object of the present invention is to provide a novel microwave frequency generator which is small in size and relatively inexpensive to manufacture as compared to conventional RF microwave generators of equal output power.

The foregoing and other objects and advantages will appear from the description to follow. In the description, reference is made to the accompanying drawing which forms a part thereof, and in which is shown by way of illustration a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

SUMMARY OF THE INVENTION

A radio frequency generator for providing high energy pulses, according to the principles of the instant invention, comprises in combination; an elongated resonant cavity having an open end and an essentially closed end; insulator means adapted to cooperate with the cavity open end and having an inwardly extending portion, the inwardly extending portion being provided with support means; an elongated resonant element centrally disposed within the resonant cavity, one end thereof being disposed within the insulator support means, the resonant element being provided with input receiving means at its other end proximate the longitudinal axis thereof; switching means disposed on the other end of the resonant element and connected to the closed end of the resonant cavity; input terminal means adapted to be coupled to a source of pulsed DC voltage and including an electrically conductive means for providing a conductive path to the resonant element input receiving means.

BRIEF DESCRIPTION OF THE DRAWING

In order that the invention may be more fully understood, it will now be described by way of example, with reference to the sole illustration which is a pictorial representation, in cross-section, of the preferred embodiment of the present invention.

DESCRIPTION OF THE PREFERRED EMBODIMENT

The preferred embodiment of the high energy radio frequency generator 10 of the present invention is shown in the sole illustration. An elongated resonant cavity 12 of the coaxial type (coaxial resonator) is provided with an open end 14 and an essentially closed end 16. An insulator element 18 is of generally circular shape and fabricated to be inserted into and seal the open end 14 of the conductive coaxial resonator 12, thereby confining all of the microwave energy within the coaxial resonator.

The insulator element 18 is provided with an inwardly extending portion 20 having a circular aperture 22 centrally disposed therein which functions as a receptacle and support for the anti-node end 26 of an elongated cylindrically-shaped resonant element 24 which preferably is one-quarter wavelength long.

The other end 28 of the resonant element 24 is provided with an aperture 30 which functions as the input voltage receiving terminal and is in electrically conductive contact with the input terminal means 32 at point 33 via an electrically conductive wire path which forms the inner conductor of a coaxial input line. The coaxial input line includes an outer conductor 35 and a dielectric 34.

The edge portion 36 of the end 28 of the resonator element 24 is provided with a first annular ring 38 transverse to the longitudinal axis 40 of the resonant element 24. A second annular ring 42 is displaced from and in juxtaposition with the first annular ring 38 and coaxially aligned therewith and connected to the closed end 16 of the coaxial resonator 12, thereby forming a spark gap 44.

An electrically non-conducting support member 46 maintains the end 28 of the resonant element 24 in a fixed position thereby fixing the spark gap 44 at a predetermined distance.

It is to be noted that the conductive path from the input terminal means 32 passes through apertures 48 and 50 provided in rings 42 and 38, respectively, thus permitting internal connection to the resonant element 24 at point 33. The point of contact 33 from the input terminal 32 is made at virtually zero microwave field so that little or no conducted microwave loss can occur via the input terminal means 32 and conductive path. Since the contact point 33 is at virtually zero microwave field, the requirement for a RF block used in the prior art resonant structures is obviated. Input terminal 32 is adapted to be coupled to a source of high voltage pulsed DC, not shown.

A conventional output probe 52 may be unobstructively provided in the cavity wall 54 at a convenient position between the open 14 and closed 16 ends of the cavity 12.

In operation, the rapid breakdown of spark gap switch 44 generates microwave oscillations within the resonant cavity 12 which are confined to the space between the resonant element 24 and the walls 54 of the cavity 12. Output energy is obtained via probe 52.

Penetration into the metallic conductors is very small due to the well-known skin effects of microwave energy, and energy loss via the input contact is virtually non-existent since the contact is made at the point of zero microwave field. The use of annular rings for electrodes to form the spark gap clearly reduces the wear occasioned by the use of a conventional spark gap which utilizes centrally located electrodes. The wear characteristics of the annular ring electrodes has been found to be one order of magnitude better, which more than offsets the initial increased difficulty in maintaining parallelism and accurate spark gap spacing over the annular region. The nature of wear with the annular ring electrodes tends to be in the direction to maintain parallelism.

It will be understood that various changes in the details, materials, arrangements of parts and operating conditions which have been herein described and illustrated in order to explain the nature of the invention may be made by those skilled in the art within the principles and scope of the invention.

Having thus set forth the nature of the invention what is claimed is:

1. A radio frequency generator for providing high energy pulses comprising in combination:
   a. an elongated resonant cavity having an open end and an essentially closed end;
   b. insulator means adapted to cooperate with said cavity open end and having an inwardly extending portion, said inwardly extending portion being provided with support means;
   c. an elongated resonant element centrally disposed within said resonant cavity, one end thereof being disposed within said insulator support means, said resonant element being provided with input receiving means at its other end proximate the longitudinal axis thereof;
   d. switching means disposed on said other end of said resonant element and connected to said closed end of said resonant cavity; and
   e. input terminal means adapted to be coupled to a source of pulsed DC voltage and including an electrically conductive means for providing a conductive path to said resonant element input receiving means.

2. A radio frequency generator according to claim 1 wherein said switch means comprises a spark gap formed with a pair of annular rings with a gap therebetween, one of said rings being disposed on an edge portion of said other end transverse to said longitudinal axis, the other of said rings being juxtaposed and coaxially aligned with said one ring and connected to said closed end of said resonant cavity.

3. A radio frequency generator according to claim 1 further including an output probe disposed through a wall of said resonant cavity between said open end and said closed end thereof.

4. A radio frequency generator according to claim 1 wherein the length of said resonant element is one-quarter wavelength.

5. A radio frequency generator according to claim 1 wherein the resonant cavity is of the coaxial type.

6. A radio frequency generator according to claim 1 wherein said resonant element receiving means includes an aperture for receiving said electrically conductive means.

7. A radio frequency generator according to claim 1 wherein said resonant element receiving means includes a contact point disposed at essentially zero microwave field.

8. A radio frequency generator according to claim 2 wherein said annular spark gap rings are provided with centrally disposed apertures to define said conductive path between said resonant element input receiving means and said input terminal means.

* * * * *